(12) United States Patent
Tobin

(10) Patent No.: US 6,718,271 B1
(45) Date of Patent: Apr. 6, 2004

(54) FAULT DETECTION APPARATUS AND METHOD OF DETECTING FAULTS IN AN ELECTRICAL DISTRIBUTION NETWORK

(75) Inventor: Patrick Thomas Tobin, Dublin (IE)

(73) Assignee: Electricity Supply Board, Dublin (IE)

( * ) Notice: Subject to any disclaimer, the term of this patent is extended or adjusted under 35 U.S.C. 154(b) by 0 days.

(21) Appl. No.: 09/486,346

(22) PCT Filed: Aug. 31, 1998

(86) PCT No.: PCT/IE98/00073

§ 371 (c)(1),
(2), (4) Date: Feb. 25, 2000

(87) PCT Pub. No.: WO99/12048

PCT Pub. Date: Mar. 11, 1999

(51) Int. Cl.[7] .............................................. C01R 31/08
(52) U.S. Cl. .................................... 702/58; 324/521
(58) Field of Search ........................ 702/58, 106, 183, 702/185, 193; 324/512, 519–530, 127, 117 R, 117 H; 700/292–295, 286; 361/93.1, 62, 63.65, 78, 79

(56) References Cited

U.S. PATENT DOCUMENTS 4,107,778 A  8/1978  Nii et al. .................... 364/492
4,251,766 A * 2/1981  Souillard ..................... 324/52
4,400,783 A * 8/1983  Locke, Jr. et al. .......... 364/483
5,428,549 A  6/1995  Chen .......................... 364/483
5,530,360 A * 6/1996  Kerchaert et al. .......... 324/379
5,659,453 A  8/1997  Russell et al. ............... 361/93

FOREIGN PATENT DOCUMENTS

FR    2 620 828    3/1989
FR    2 650 078    1/1991
WO    96/14585    5/1996

* cited by examiner

Primary Examiner—Marc S. Hoff
Assistant Examiner—Paul Kim
(74) Attorney, Agent, or Firm—Venable LLP; Ralph P. Albrecht

(57) ABSTRACT

A fault detection apparatus for use in an electrical distribution network to distinguish normal network operations from various network faults. Pre-event and post-vent signal patterns are compared and analyzed to produce an event characteristic which distinguishes the faulted feeder and the faulted phase. The characteristic also allows for discrimination between the various events and controls network response accordingly.

23 Claims, 15 Drawing Sheets

PRIOR ART
Distribution Network

Earth Fault

Switching

Earth Fault
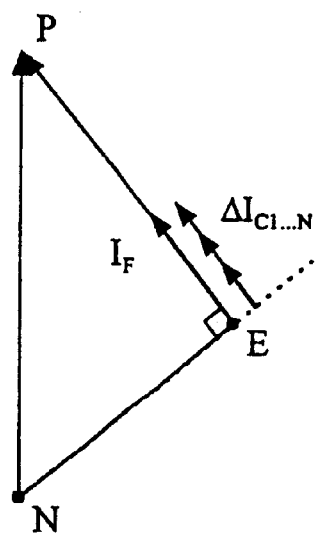
Switching
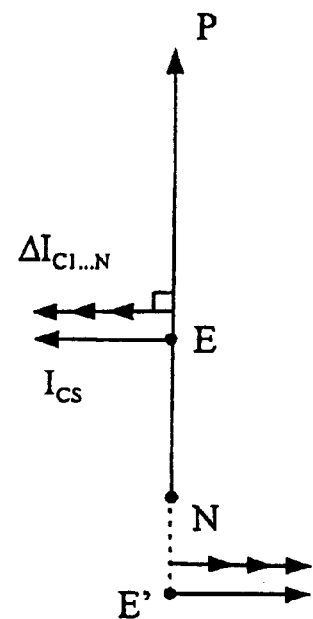
Figure 4a
Figure 4b

Loadside Break On 3 Phase Line

Paralleling through 1 Pole switching

(a)

(c)

(b)

(d)

Paralleling through Boosters

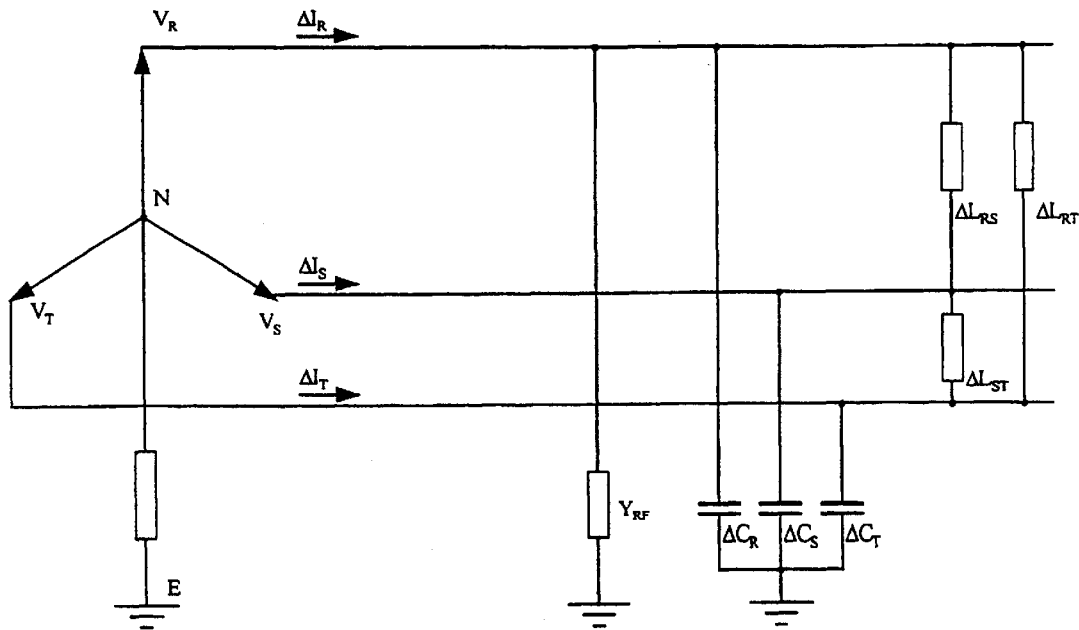

FIG 10b $$\begin{vmatrix} V_{REx} & -V_{REy} & 0 & 0 & V_{RSx} & 0 & -V_{TRx} \\ V_{REy} & V_{REx} & 0 & 0 & V_{RSy} & 0 & -V_{TRy} \\ 0 & 0 & -V_{SEy} & 0 & -V_{RSx} & V_{STx} & 0 \\ 0 & 0 & V_{SEx} & 0 & -V_{RSy} & V_{STy} & 0 \\ 0 & 0 & 0 & -V_{TEy} & 0 & -V_{STx} & V_{TRx} \\ 0 & 0 & 0 & V_{TEx} & 0 & -V_{STy} & V_{TRy} \\ 0 & 1 & 1 & 1 & 0 & 0 & 0 \end{vmatrix} \times \begin{vmatrix} Y_{RF} \\ \Delta C_R \\ \Delta C_S \\ \Delta C_T \\ \Delta L_{RS} \\ \Delta L_{ST} \\ \Delta L_{TR} \end{vmatrix} = \begin{vmatrix} \Delta I_{Rx} \\ \Delta I_{Ry} \\ \Delta I_{Sx} \\ \Delta I_{Sy} \\ \Delta I_{Tx} \\ \Delta I_{Ty} \\ 0 \end{vmatrix}$$

FIG 10c

Calculation of Feeder Admittance Values

| Reference | Disturbance | $\Delta I_o$ | $\Delta I_{ph}$ | Action | Network Condition | Phasors |
|---|---|---|---|---|---|---|
| 1. | Simple Earth Fault | $\Delta I_o // V_{FF}$ | $\Delta I_o < \Delta I_{FF}$ | Operate FPE | | |
| 2. | Single Phase Conductor Break | $\Delta I_o // V_{FF}$ | Source Break: $\Delta I_o > \Delta I_{FF}$ generally Remote Break: $\Delta I_o < \Delta I_{FF}$, $\Delta I_{FP} \sim //$ Other Phase | Operate FPE | | |
| 3. | Single Phase Switching/Fuse Blowing | $\Delta I_o \sim // V_{FP}$ or $\Delta I_o$ at $\sim 180° V_{FF}$ | $\Delta I_{FP} \simeq 0$ | None | | |
| 4. | Earth Fault Off | $\Delta I_o$ at $\sim 180° V_{FF}$ $\Delta I_o \sim // V_{IIP}$ | $\Delta I_o < \Delta I_{FF}$ $\Delta I_o$ at $\sim -90° \Delta V_{NE}$ $\Delta I_{FP}$ at $\sim -90° \Delta V_{NE}$ | None | | |
| 5. | Remote Break on 3 Phase Conductor | $\Delta I_o$ at $\sim 180° V_{FF}$ | $\Delta I_o < \Delta I_{FF}$ $\Delta I_o \sim // \Delta I_{FF}$ | Open Feeder Circuit Breaker | | |
| 6. | Paralleling Through Booster | One Side: $\Delta I_o \sim // V_{FF}$ Other Side: $\Delta I_o$ at $\sim 180° V_{FF}$ | $\Delta I_o$ at $\sim 180° \Delta I_{FP}$ | None | | |
| 7. | Paralleling with Single Pole Switches | One Side: $\Delta I_o \sim // V_{FF}$ Other Side: $\Delta I_o$ at $\sim 180° V_{FF}$ | $\Delta I_o$ at $\sim 180° \Delta I_{FP}$ $\Delta I_o \simeq \Delta I_{FF}$ | Open Neutral Switch | | |
| 8. | Inrush Current | Harmonic Content | | None | | |

FIG. 11

FAULT DETECTION APPARATUS AND METHOD OF DETECTING FAULTS IN AN ELECTRICAL DISTRIBUTION NETWORK

BACKGROUND OF THE INVENTION

The present invention relates to a fault detection apparatus and method of detecting faults in an electrical distribution network and more particularly to an apparatus and method for detecting faults in a network utilizing a neutral earthing system.

Three phase distribution networks carry energy along three separate conductors while maintaining a voltage difference between any two of the conductors (line voltages). Under normal operating conditions the three voltages are symmetrical about a neutral point. Voltage measured between a conductor and the neutral point is referred to as the phase voltage.

Where star (Y) connected transformer windings are used at a source station, the star point corresponds to the neutral position. For certain circuits this neutral point is brought out as a fourth conductor and can carry load current for loads connected between a phase and earth. This is the common arrangement for low voltage (LV) circuits and is used extensively in the United States of America.

Each conductor or phase also has a voltage with respect to its surrounding environment, mainly the local ground or earth. Load current normally flows out in one or more of the phases and returns through the other phase wire(s). In the event of a fault, for example a conductor coming in contact with the ground, some of the current flows into the ground. This fault current must find its way back to the source, i.e. into the electrical network. The network neutral point is generally connected to earth at the source to provide such a return path. Fault current for a network earth fault therefore generally flows from the phase conductor, through the earth and back through the neutral-earth connection.

There are many ways to connect the network neutral to earth, for example, it can be solidly connected. In this case large currents can flow in the event of a network earth fault. Such faults can be detected easily but must be cleared rapidly to minimise safety hazards and equipment damage. Solid earthing is predominantly used on cabled networks, where fault rates are lower and faults must be detected and cleared quickly to contain damage to cables.

Alternatively, the neutral point can be left isolated. In this case fault current flows back into the system through a weak capacitive connection between the earth and the remaining phase wires. Relatively little fault current can flow through this capacitive link in the event of a fault and faults are more difficult to detect. However by taking certain precautions, these faults can be tolerated on the network, that is it is not necessary to trip the circuit straight away and interrupt supply to customers. Isolated neutral earthing is predominantly used on rural overhead networks, where faults are much more frequent, damage is less severe and it is desirable to minimise frequent outages.

In another form of neutral earthing, an impedance such as a resistor is used in the neutral-earth link to limit the amount of current that can flow in a fault. Where low impedance devices are used, so that faults can be detected easily but must be cleared quickly, the arrangement is referred to as low impedance earthing. Where high impedance devices are used, fault currents are limited so that damage is limited and faults can be sustained on the network. This arrangement is referred to as a high impedance earthed network. Isolated neutral networks fall into the category of high impedance earthed networks, as the capacitive coupling referred to above is effectively a high impedance link to earth.

High impedance earthed networks offer better operational performance in rural overhead networks when earth faults can be detected reliably. Once a fault is detected the simplest corrective measure is to trip the circuit. However, where frequent faults events occur this can be very disruptive for customers. Where it is desired to maintain supply in the event of a fault, the fault current must be brought to a very low level at the fault site.

There are two method used for reducing the fault current at a fault site. One method is to install an arc-suppression coil in the neutral-earth link at the source station. The coil diverts or tunes out most of the fault current. The second method involves the use of an earthing switch to connect the faulted phase directly to earth in the source station. This switching shorts out the fault diverting the bulk of the fault current directly to the station. This method is referred to as faulted phase earthing (FPE).

The impedance of the fault at the fault site also determines the amount of current that flows in an earth fault. Low impedance faults facilitate current flow allowing the fault to be detected more readily, whereas high impedance faults restrict current flow making detection more difficult. High impedance faults are typically associated with fallen conductors or accidental contact with a live conductor and are extremely dangerous despite the restricted current flow. It is highly desirable to be able to detect such high impedance faults. The ability of a protection system for an electrical distribution network to be able to detect high impedance faults is referred to as its sensitivity.

There are also factors militating against sensitive protection. During the normal operation of a network there is always a certain amount of current flowing to earth through the inherent capacitive links between each phase conductor and earth. When one of the wires is switched, for example, during normal operations or load switching, these currents can be interrupted or become unbalanced. Unbalance currents flow in the earth and in any neutral-earth link, similar to the behaviour of current in an earth fault. As these are normal operational events, the protection system must either discriminate between such events and real faults or it must be de-sensitised to them.

These issues arise in relation to overhead medium voltage (MV) distribution networks which are much more extensive than underground networks. As the conductors are exposed to weathering they are considerably more fault prone. Additionally, bare conductors overground increases the risk of exposing the public to hazards in the event of an accident or plant failure.

In a low impedance earthed network, earth fault protection usually relies on detecting the fault currents associated with a fault and is referred to as over-current protection. A modified over-current protection system utilizes the power flow associated with an earth fault and is referred to as directional over-current protection. Neither protection system can discriminate between high impedance faults and operational events. The sensitivity of these systems is therefore limited by the need to avoid reacting to operational events.

In a high impedance earthed network, the phase voltages during an earth fault are disturbed. These disturbances can be used to detect earth faults in a protection system referred to as voltage displacement protection which is also affected by operational events and must operate with limited sensitivity. To limit spurious operation a threshold of 30% neutral displacement is often used. The sensitivity is thus limited to 30% of the maximum possible fault current, for example, in a 10 kV network with a 15 A maximum fault current, sensitivity would be 5 A. Any fault below 5 A would not be detected.

Wattmetric protection measures residual current on a feeder and forms a product with the neutral voltage displacement from earth. The product gives a directional indication of the source of the fault and can be used to identify faulty feeders. Wattmetric protection techniques however cannot discriminate between earth faults and imbalance effects.

The method of neutral earthing used has a significant impact on the performance of a MV distribution network, particularly when applied to an overhead network. Neutral earthing techniques determine the manner in which earth faults are detected and treated. They also determine the degree of stress, particularly voltage stress, on the network.

In a low impedance neutral system, when an earth fault occurs, the faulted phase must be tripped which has continuity and supply quality implications. With high impedance earthing such earth faults may be sustained which can in turn have safety implications. High impedance earthing imposes higher voltage stress on a network and can lead to cross-country faults which can have much more serious consequences than a simple earth fault. However, high impedance earthing has an overall positive impact on supply continuity and supply quality for overhead networks.

The method of neutral earthing used also determines the fault currents and voltages arising in the network in the event of an earth fault. Earth fault protection systems must therefore be adapted to the neutral earthing technique used. Using low impedance neutral earthing, for example on an existing 20 kV network, conventional over-current or wattmetric type protection may be used to provide a reasonable degree of protection. Where high impedance neutral earthing is required a more sophisticated technique is needed.

If high impedance neutral earthing of a rural MV networks is required, two options become available. Firstly, arc-suppression with a Petersen coil is frequently used for this purpose. However, there are significant difficulties with arc-suppression in rural networks. The widespread use of single phase spurs in a rural network and the consequent phase imbalance cause significant neutral voltages above earth potential and continuous voltage stress on the network. Arc-suppression techniques therefore need to be supplemented with a sophisticated compensation system. Furthermore arc-suppression is not as safe as faulted phase earthing (FPE), where earth faults are sustained on the network.

The second option is to use FPE which provides a simpler and cheaper solution which facilitates handling typically unbalanced rural networks. Lower voltages at fault sites also result in sustainable earth faults with greater safety. FPE utilised alone can cause severe voltage transients on the network when phase to earth switches are opened and closed.

The performance requirements for earth fault detection and handling are very demanding and may be summarised as follows:

High Level of Sensitivity
 A very dangerous type of fault is a fallen conductor, which brings high voltage down to ground level within reach of the public. Where the fallen conductor is on the source side of a break, that is, directly connected to the source, there is a reasonable probability of fault detection depending on ground conditions. Where the fallen conductor is on the load side of a break the fault can be considerably more difficult to detect. The fault current must flow through the downstream load and back to the fault. If there is little load connected at that time, for example at night, the load impedance can be quite high.
 For example 40 kVA of single phase load at 20 kV would correspond to a load impedance of about 12,000 ohms. This would limit the earth fault current to about 1 amp. The ground potentials at the fault site may be low but somebody dislodging the conductor would be exposed to lethal voltage levels. It is therefore desirable to detect as many of these faults as possible. Detection of such high impedance faults down to a fault current of 1 amp at least is required. This fault current corresponds to a fault impedance of 12,000 ohms, which includes the effect of any limiting load impedance.

Immunity to Imbalances
 Where extensive single phase networks are used for example on rural MV networks significant imbalances are common. Furthermore, single pole switching and fuse blowing cause imbalances very similar to earth faults. For example, opening a link or blowing a fuse on a 50 km long single phase spur takes 50 km of conductor from one phase and transfers it onto the other phase through the load. The effect is to cause an unbalanced current of about 1.8 A in the neutral of a of 20 kV network or a neutral displacement of about 10% in the case of a 10 kV isolated neutral network. Similar events in a three phase network have even greater effects especially when the switching occurs close to the source station. Such events are inherent in networks. Sensitive earth fault protection detects such events and therefore it is vital that increasingly sensitive earth fault protection is able to discriminate such events from fault conditions to avoid inappropriate reactions.

Boosters
 The use of boosters in an open delta (Δ) configuration introduces an additional complication. When a network is parallel-connected through a booster, the open delta configuration causes a shift in the position of the neutrals between the two networks. This neutral shift causes a circulating current in the neutrals of an earthed neutral 20 kV network or neutral displacement in the case of a 10 kV network. It is necessary for sensitive earth fault protection to distinguish between such effects and a real earth fault.

Switching
 Single pole switching to parallel networks introduces a voltage displacement between the neutral points. If there is a difference in the voltage drops between the networks where they are parallel-connected, the difference is taken up in the neutral points. This difference causes circulating currents in the neutrals, which from the source appear very similar to an earth fault. Again, adequate earth fault protection must be able to discriminate between switching and an earth fault.

Identification of Faulted Feeder
 If a faulted phase is to be taken off line it is essential to be able to identify the faulted feeder in the event of an earth fault. In the case of faulted phase earthing (FPE), identification of the faulted phase for switching is required. As there are at least three types of MV overhead network in common rural networks, an integrated solution applicable to all these networks is highly desirable.

The demands on sensitive earth fault protection for rural networks are particularly severe due to the provision of single phase spurs to accommodate the extensive use of single phase construction and operating devices. A high degree of sophistication for a neutral earthed protection system is needed to distinguish between high impedance earth faults and the impact of normal operating events.

There have been several efforts in the United States of America particularly to use the transient effects arising from a fault to detect high impedance faults which has been successful in several aspects. However, different solutions have been developed for differing classes of fault and no universal solution based on analysing such transient effects has evolved. Present systems attempt to amalgamate the existing various techniques into a composite system to apply the most appropriate technique to a particular fault. Alternatively, all the available techniques are applied simultaneously and a consensus derived between them on whether there is a fault or not.

Medium voltage (MV) distribution networks in the United States of America carry the neutral point as a fourth conductor which normally carries load current and the neutral point must be solidly earthed. This arrangement considerably complicates sensitive earth fault protection. In such arrangements there is little option but to pursue transient based detection techniques.

For a balanced three phase network with arc-suppressed neutral earthing, a further form of transient detection technique has been developed in Sweden. This technique is not suitable for rural distribution network, which make extensive use of single phase distribution.

In France, the national utility EDF have developed a technique for analysing the patterns of currents flowing in the faulted feeder and in all neighbouring feeders to sensitively detect earth faults. This system can detect very high impedance faults, identify the feeder in question but it cannot identify the faulted phase. This is necessary to identify the faulted phase for earthing. The EDF system also cannot discriminate sensitively between single phase events and high impedance faults. This problem is not significant as all EDF networks are three phase and do not use single phase switching or protection techniques. This arrangement would not be acceptable for other networks particularly rural networks, where single phase distribution is common.

U.S. Pat. No. 5,659,453 discloses an apparatus for detecting arcing faults on power lines carrying a load current by identifying bursts of each half cycle of the fundamental current. While the apparatus and method shown is highly suited to the detection of arc faults it does not show or suggest a method for detecting permanent, non arcing faults.

SUMMARY OF THE INVENTION

It is an object of the present invention to alleviate the disadvantages associated with the prior art and to provide an apparatus and method for detecting faults in an electrical network and discriminating between faults and other network phenomena.

Accordingly there is provided a fault detection apparatus for use in an electrical distribution network of the type comprising:
  one or more feeders, each feeder having one or more phase for delivering power to a load connection of the network;
  a power source, producing electrical power for the or each feeder; and
  a signal acquisition means for communicating with the network measuring network signals;
wherein the signal acquisition means is connected to a comparator and incorporates:
  means for identifying and storing a pre-event signal pattern from the electrical distribution network;
  monitoring means for detecting an event in the electrical distribution network and activating the signal acquisition means to identify a post-event signal pattern; and
  means for delivering the pre-event signal pattern and the post-event signal pattern to the comparator;
the comparator including means for comparatively analysing the pre-event signal pattern and the post-event signal pattern.

Ideally the comparator incorporates means for generating an event characteristic from the pre-event signal pattern and the post-event signal pattern to identify a particular event type.

Preferably the event characteristic includes a faulted feeder discriminator.

Preferably the event characteristic includes a faulted phase discriminator.

In a preferred embodiment the event characteristic is parsable to identify a fault condition on the electrical distribution network.

In one arrangement of the invention the fault condition identified is a source side fault.

In a further arrangement the fault condition identified is a load side fault.

In a particularly preferred embodiment the event characteristic incorporates an operational event register for distinguishing network operations from network faults.

Preferably the operational event register incorporates means for indicating a switching event.

Preferably the operational event register incorporates means for indicating a paralleling event in the electrical distribution network.

In one embodiment the signal acquisition means comprises:
  a current transformer for reading a phase current from a phase of a feeder;
  a current transformer for reading an earth linkage current; and
  a voltage transformer for reading phase voltages.

Preferably the signal acquisition means incorporates signal conditioners.

Preferably the monitoring means incorporates means for assessing instantaneous phase currents and voltages.

Ideally the monitoring means comprises means for analysing time based signals to determine the magnitude and phase of all currents and voltages.

Preferably the comparator incorporates means for comparing instantaneous phase currents and voltages from preceding phase currents and voltages to produces incremental values.

Ideally the apparatus incorporates switching means to prevent damage to the network when a fault condition is detected.

Ideally the apparatus incorporates switching means to prevent injury to personnel when a fault condition is detected.

According to one aspect of the invention there is provided a method for fault detection in an electrical distribution network comprising the steps of:
  identifying and storing a pre-event signal pattern from the network;
  monitoring the electrical distribution network to detect an event in the network;

identifying and storing a post-event signal pattern in response to the monitored event; and comparatively analysing the pre-event signal pattern and the post-event signal pattern.

Ideally the step of comparatively analysing the pre-event signal pattern and the post-event signal pattern comprises the steps of:

monitoring instantaneous phase currents and voltages;

comparing instantaneous phase currents and voltages with preceding phase currents and voltages to produce incremental values;

determining whether the incremental values exceed predetermined threshold values or phase angles approach predetermined quantities; and discriminating currents and voltages generated from values generated during fault switching and normal operating event.

According to another aspect of the invention there is provided an electrical distribution network for discriminating between network operational events and fault conditions using a fault detection apparatus.

Accordingly, the present invention provides a fault detecting apparatus for use in an electrical distribution network, the apparatus comprising:

signal acquisition means;

monitoring means for assessing instantaneous phase currents and voltages;

comparator means for comparing instantaneous phase currents and voltages from preceding phase currents and voltages to produce incremental values;

means for determining whether the incremental values exceed predefined threshold values or phase angles approach predefined quantities;

means for discriminating current and voltage values thus generated from values generated during fault switching and normal operational events; and switching means to enable precautionary or remedial measures when a fault condition is detected, whereby a fault detection apparatus of improved sensitivity is realised for mixed three phase and single phase distribution networks.

The signal acquisition means comprises current transformers for reading phase currents on each of the feeders and for reading the earth linkage current and voltage transformers for reading phase voltages. The analogue signals are conditioned, sampled and converted to digital data signals. Signals acquisition includes filtering the digital signals to extract quantities at the distribution network frequency, for example, at 50 Hz.

The monitoring means for assessing phase currents and voltages comprises means for analysing time based signals to determine the magnitude and phase of all currents and voltages. Under certain conditions a trigger is activated to store preceding magnitude and phase information.

The comparator means compares the magnitude and phase information stored to magnitude and phase information subsequently processed.

Where a fault is detected, the type and source of the fault is determined and precautionary or remedial measures are enabled.

For high impedance earthed networks using faulted phased earthing (FPE), the following procedure is used: Initially in a fault condition, a faulted phase earthing (FPE) switch is closed on the faulted phase. A predetermined fault clearing period elapses at which time all magnitude and phase information is stored before the closed FPE switch is opened. The comparator means then compares the stored information with information acquired following FPE switch opening. If the fault is still present, the FPE switch is activated again. Corresponding procedures may be used where other forms of system earthing is implemented.

Where the fault persists or recurs, "lock-out" is initiated where the FPE switch on the faulted phase is closed, the neutral-earth linkage switch is opened and an alarm is triggered. In this case, manual intervention is required before the FPE switch and linkage switch are returned to their normal operating positions.

In the event of a disturbance condition, where circulating currents are detected, the normally closed neutral earth linkage switch is opened to break the zero sequence current loop and prevent other protection from operating. Following a predetermined clearing period, all magnitude and phase information is stored before reclosing the linkage switch. The comparator means then compares the stored information with information acquired after the neutral-earth linkage switch is closed. If the disturbance is still present, the linkage switch is opened again. If no disturbance is present the monitoring means resets and continues to analyse the time based signal until a disturbance condition is recognised and the trigger is activated.

A manual mode is provided to facilitate the manual activation of FPE switches and the neutral-earth linkage switch. A reset mode is also provided for resetting the fault detecting apparatus after "lock-out".

The fault detecting apparatus includes a controller circuit for implementing the signal acquisition means, the monitoring means, the comparator means, the fault determining means and the discriminating means and for processing data from said means, the controller including output drivers for sending actuation signals to the switching means.

The switching means include faulted phase earthing (FPE) switches, a neutral-earth linkage switch and feeder circuit breakers.

The controller circuit operates under a Supervisory Control and Data Acquisition (SCADA) system.

One problem in analysing network signals to detect fault situations is to isolate the currents and voltage displacements arising from the event. The technique of comparing the signals before and after the event is an effective means of isolating those components arising directly from the event for use in further analysis. The resulting signals are used to detect parameter patterns created during the events and the patterns are then associated with a fault or with an operational event to indicate if a fault has occurred. The parameters pattern recognition techniques have been developed from first principles.

The present invention seeks to achieve good discrimination between faults and operational events, it identifies both the faulted feeder and the faulted phase and can provide some information on the nature of a fault or event. The fault detecting apparatus can therefore be used on a high impedance, neutral earthed distribution network, which makes extensive use of single phase circuits and devices. The apparatus may also be used in conjunction with faulted phase earthed (FPE) protection schemes as it can identify the faulted phase for earthing. While the present invention is more applicable to high or low impedance earthed networks it can also be used on solidly earthed networks. The apparatus is unsuitable for use with American 4 wire distribution networks.

The present invention further provides a method of detecting faults in an electrical distribution network, the method comprising:

acquiring data signals;

monitoring instantaneous phase currents and voltages;

comparing instantaneous phase currents and voltages with preceding phase currents and voltages to produce incremental values;

determining whether the incremental values exceed predetermined threshold values or phase angles approach predetermined quantities;

discriminating currents and voltages generated from values generated during fault switching and normal operating events; and activating precautionary or remedial measures when a fault condition is detected.

On detecting an earth fault, the earth switch for the faulted phase is closed and is re-opened after a short period, such as one second, to check whether the fault has cleared as a transient fault. If the fault persists, the earth switch is closed again and left closed as a permanent fault which calls for manual intervention.

The neutral earthing resistor switch remains closed for the initial short closure of the faulted phase earthing (FPE) switch which short-circuits the neutral resistor for that period. When a permanent fault is indicated and the FPE switch is closed for a longer period, the neutral resistor switch is opened, realising an isolated neutral network. The FPE switch can then be left on indefinitely. Before the FPE switch is again opened, the neutral earth switch is closed to suppress any transient overvoltages which may occur.

BRIEF DESCRIPTION OF THE DRAWINGS

The invention will now be described more particularly with reference to the accompanying drawings which shows, by way of example only, one embodiment of high impedance neutral earthing system according to the present invention. In the drawings:

FIGS. 4a and 4b are phasor diagrams illustrating feeder capacitor currents during an earth fault and a single pole switching event, respectively, for an isolated neutral network;

FIGS. 10b and 10c are a schematic diagram of a network with a fault and a fault analysis matrix corresponding to the faulted network, respectively;

FIG. 11 is a tabular summary of criteria used to distinguish disturbance event patterns.

DETAILED DESCRIPTION OF THE INVENTION

Figure 1:
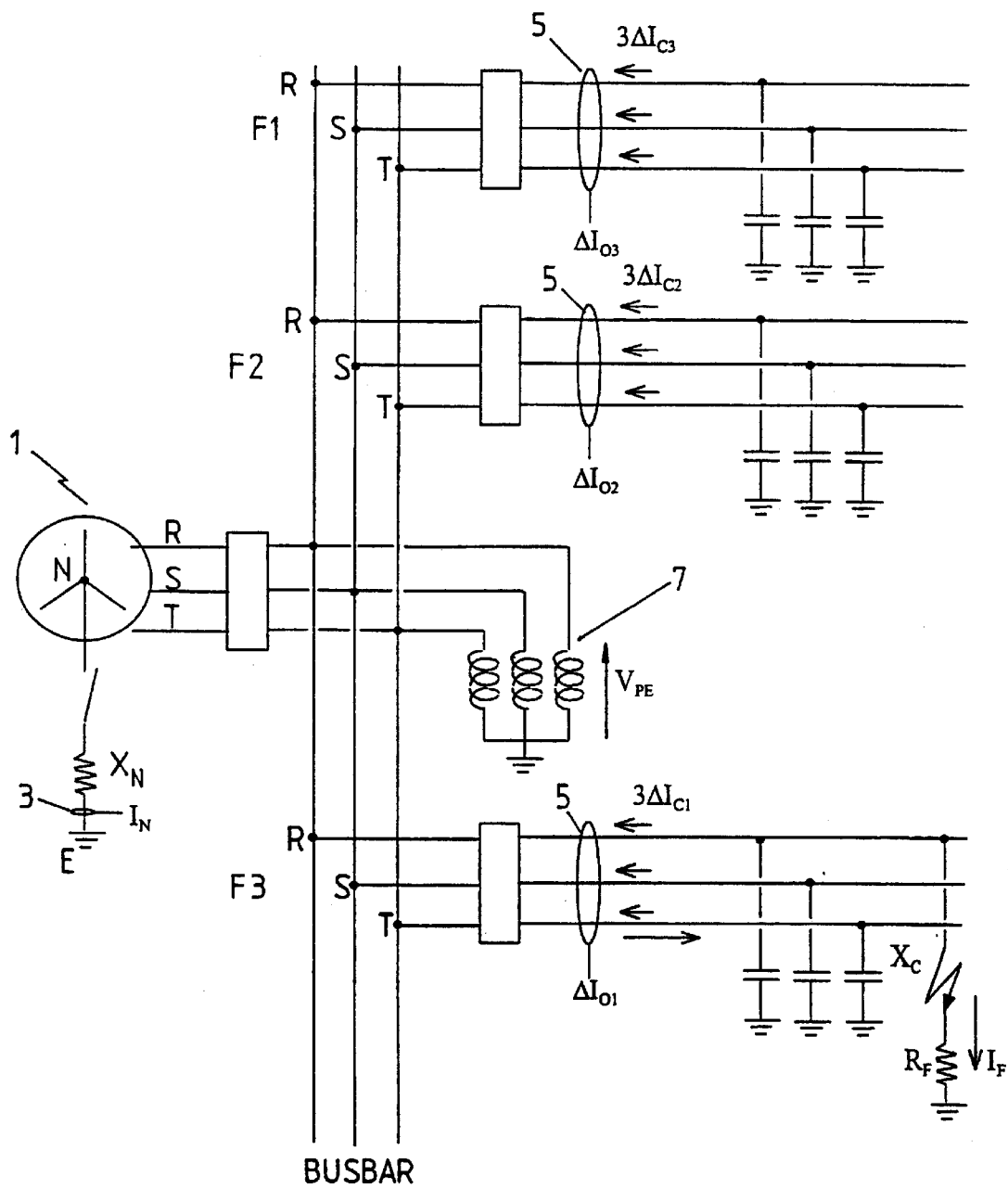
FIG. 1 is a schematic general arrangement of an electrical distribution network showing an earth fault.

The foregoing and other features and advantages of the invention will be apparent from the following, more particular description of a preferred embodiment of the invention, as illustrated in the accompanying drawings wherein like reference numbers/characters generally indicate identical, functionally similar, and/or structurally similar elements.

Referring to the drawings and initially to FIGS. 1 to 5b, a number of conditions arise on a distribution network. These conditions include earth faults, conductor breaks, switching events and neutral voltage shifts. The first two conditions represent fault situations. It is essential for efficient operation of the networks to differentiate these conditions from the normal operational events.

A general arrangement for a distribution network is shown in FIG. 1. The network comprises a power source station 1 having a neutral point N which is connected to earth E via an earthing impedance $R_N$. A current transformer 3 measures the neutral current $I_N$.

Phase lines R,S,T are connected to feeders F1,F2,F3 and current transformers 5 are provided to measure current $\Delta I_{01}$, $\Delta I_{02}$, $\Delta I_{03}$ in each feeder F1,F2,F3. The phase to earth voltage $V_{PE}$ is measured via voltage transformers 7. An earth fault is generally manifested as a resistance $R_F$ between a phase conductor and earth E. Complications can arise in that the value of this resistance can vary significantly during the fault. For a re-striking fault it can go open circuit for a short period. The fault can re-establish when the voltage at the fault site recovers.

Each conductor has a capacitance C to earth. The capacitive impedance $X_C$ is normally supplied with positive sequence (balanced) current. When an earth fault arises there is some shift in the neutral voltage to earth. This shift disturbs the currents flowing through the network capacitances. The final effect is that an additional current, equal to a shift in the neutral voltage divided by the capacitive reactance, is superimposed on all the conductors regardless of phase or feeder. This incremental current all flows in the same direction to give a zero sequence or residual current on each feeder so that the capacitive currents are unbalanced by this amount. However, the capacitive currents after the fault are not of primary interest, the zero sequence or incremental currents attributable to the event are.

It should be noted that any neutral earthing impedance, for example an earthing resistor, will also contribute current to the fault. This current will be equal to the neutral voltage shift divided by the earthing impedance $R_N$.

The current $I^F$ flowing through the earth fault $R_F$ returns through the combination of total network capacitance and neutral earthing impedance $R_N$. The neutral voltage displacement is therefore determined by the relation between the fault resistance $R_F$ and the combined effect of the paralleled network capacitance and neutral earthing impedance $R_N$.

Figure 2A:
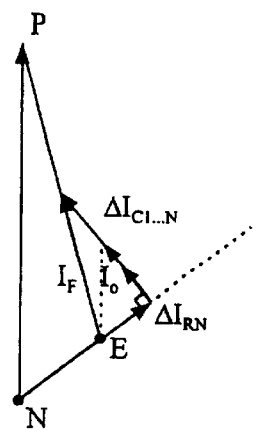
FIGS. 2a and 2b are phasor diagrams illustrating feeder currents and voltages during an earth fault and a single pole switching event for a resistance earthed network, respectively.
Figure 2B:
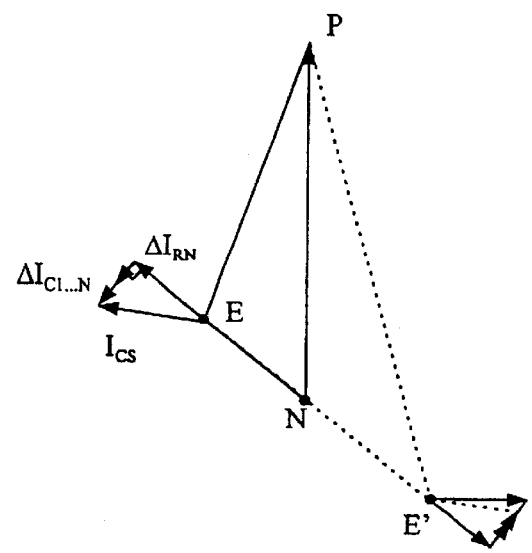

The voltage relationships for resistance earthed networks are illustrated in FIGS. 2a and 2b and for isolated neutral networks in FIGS. 4a and 4b. The fault current $I_F$ is in phase with the phase-earth voltage $V_{PE}$ and shows up as a residual current in the faulted feeder.

The fault current $I_F$ is fed by the incremental currents $\Delta I_C$ flowing in the network capacitance and the current flowing $\Delta I_{RN}$ in any neutral earthing impedance.

For resistance earthed networks the current in the neutral resistor $I_{RN}$ is in phase with the neutral voltage displacement $V_{NE}$. The feeder capacitive currents associated with the fault $I_{C1} \ldots _N$ are in quadrature with the shift in neutral voltage $V_{NE}$ as shown in FIG. 2a. The total current flowing in the fault $I_F$ is the sum of these zero sequence capacitive currents $\Delta I_{C1} \ldots _N$ and the current $\Delta I_{RN}$ flowing in the neutral earthing impedance $R_N$. This fault current $I_F$ is in phase with the phase to earth voltage $V_{PE}$ at the fault site. The residual current $I_O$ in the faulted feeder is the fault current $I_F$ less the zero sequence capacitance currents flowing in that feeder. The residual current $I_O$ is shown by the dotted line in FIG. 2a. The faulted feeder capacitance currents $\Delta I_{C1} \ldots _N$ can be regarded as flowing back to the source 1 and out again on the faulted phase effectively cancelling when the residual current is measured. The residual currents on the non-faulted feeders are the zero sequence capacitance currents $I_{C1} \ldots _N$. The residual current $I_O$ in the faulted feeder will almost be in phase with the phase to earth voltage $V_{PE}$ for the faulted phase, lagging only by a few degrees. The residual currents for the non-faulted feeders will lead this phase to earth voltage $V_{PE}$ for the faulted phase. From a knowledge of the feeder residual currents and the current in any neutral earthing impedance $R_N$ it is possible to estimate the fault current $I_F$.

During a single pole switching event an increment of line capacitance $C_S$ is effectively being switched on or off the network. The load changes as such will not impact on the zero sequence or residual quantities. By increasing the network capacitance on a phase by "switching in" a section of line there is an increase in the capacitive current $I_{CS}$ for that phase. This is illustrated diagrammatically in FIG. 2b. The change in network capacitance causes a shift in the neutral voltage $V_{NE}$. There is a corresponding change in the neutral earthing resistor current $I_{RN}$ in phase with the change in the neutral voltage $V_{NE}$. There are similar changes in the charging currents $\Delta I_{C1} \ldots _N$ for all connected feeders in quadrature with the neutral voltage shift $V_{NE}$. All of these incremental currents $\Delta I_{RN}$, $\Delta I_{C1} \ldots _N$ add to the additional charging current $I_{CS}$ required by the section of line capacitance $C_S$ switched in. The residual current $I_{CS}$ for the affected feeder is almost in quadrature with the phase to earth voltage $V_{PE}$ for the affected phase. When "switching out" a section of line, as illustrated by the dotted lines in FIG. 2b, there is a decrease in charging current $I_{CS}$ on the affected phase. The polarities for all changes referred to above, are reversed, however the residual current change $I_{CS}$ for the affected feeder again is almost in quadrature with the relevant phase to earth voltage $V_{PE}$, as above.

In a fault condition, a resistance $R_F$ between the phase P and earth E is being switched in and for network switching, a capacitance $C_S$ between the phase P and earth E is switched in. The patterns of incremental currents $I_O$, $I_{CS}$ arising from these two events are in quadrature between the events. There is therefore a strong basis for distinguishing between them.

In the event of a fault the phase affected can be readily identified from the voltage $V_{PE}$ nearly in phase with the change in residual current $I_O$. The feeder F1,F2,F3 affected can likewise readily be identified from the angles formed between the feeder residual current changes $I\Delta_{01} \ldots _N$ and the faulted phase voltage to earth $V_{PE}$. Basic single pole switching events can readily be distinguished from the strong difference in the phase patterns between these and fault events.

As stated above, a single pole switching event connects or disconnects a length of conductor from a phase increasing or decreasing capacitive current on the affected phase. While this current is in quadrature with the respective phase voltage, it is within 30° of the other phase voltages. Taking the cosine of this angle gives a factor of 0.87 which is only a 13% reduction of a current in direct phase alignment with one of the unaffected phase voltages, as for an earth fault. However, when a length of conductor is "switched out" of one phase, it is "switched in" to another phase through the load. This combination of decrease on one phase and increase one another brings the resultant unbalanced current into closer alignment with the other unaffected phase voltage. As shown diagrammatically in FIG. 3, when for example a fuse blows on the T-phase, the transfer of conductor onto the S phase causes an imbalance in the currents, the sum of which currents is closely in phase with the R phase.

Figure 3:
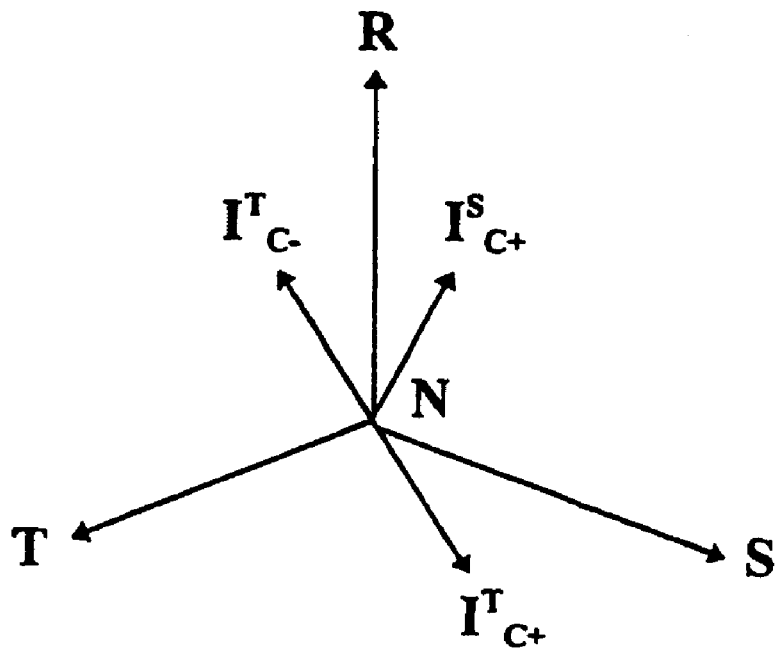
FIG. 3 is a phasor diagram illustrating unbalanced currents resulting from an open circuit (blown fuse, for example) on one phase.

When single pole switching events occur on single phase network, where a section of conductor is disconnected from one phase, the section of conductor is back-connected to the other phase through the load. This yields a compound effect with a capacitance decrease on one phase and a corresponding increase on the other phase of the circuit. This situation gives rise to a change in residual current in phase with one of the phase to earth voltages, as indicated in FIG. 3, and effectively mimics the pattern for an earth fault. However, the phase voltage approached is the third phase, which is unaffected by the switching event. Thus by monitoring the change in current for the phases, discrimination between this event and a real earth fault is facilitated.

For an earth fault the phase affected will show a change in current equal to the fault current. For a single pole switching event there will be no change in current for the suspected phase. There will be a change in current, caused both by the change in network capacitance and a dropping or taking up of load, for the other two phases. Analysis of the phase current changes therefore discriminates between the events.

For isolated neutral networks the situation is similar in principle to that for a resistance earthed network. In this case there is no current flow in a neutral earthing resistor ($I_{RN}$=0). The corresponding phase relationships for an earth fault and for a basic switching event are illustrated in FIGS. 4a and 4b, respectively. For an earth fault, the change in neutral voltage forms a right angle with the affected phase voltage to earth $V_{PE}$. The residual currents $\Delta I_{C1} \ldots _N$ arising from a fault are in phase with the voltage to earth $V_{PE}$ for all feeders. However, the direction of residual current flow for the faulted feeder will be outward towards the fault. Current flow is in the opposite direction for the healthy feeders. For a basic single pole switching event, the neutral voltage displacement $V_{NE}$ will be in phase with the affected phase voltage to earth $V_{PE}$ while the changes in residual current $\Delta I_{C1} \ldots _N$, $I_{CS}$ will be in quadrature with the phase voltage to earth $V_{PE}$. This is illustrated in FIG. 3b both for "switching in" and "switching out" a section of conductor. For compound effects arising from single pole switching, analysis of the phase current changes discriminates the event from a real fault in the same manner as for resistance earthed networks.

A conductor break is more complex event than a simple earth fault. For example and with reference to FIG. 5a, where a single phase conductor breaks (a relatively common event) the following situations can arise:

(a) Where the conductor connects to ground on the source side of the break, a simple earth fault, which is generally detectable, occurs. Here the fault resistance is $R_{FS}$.

(b) Where the conductor connects to ground on the load side of a break, the section of conductor is supplied from the other phase through the load resistance $R_L$. The fault resistance is $R_{FL}+R_L$ and an earth fault is present on the other phase.

For a single phase network downstream load can be small particularly at night and consequently the load resistance $R_L$ can be high. However, the fault can still be detected and treated as an earth fault on the other phase provided the sensitivity of the earth fault protection is adequate.

Figure 5A:
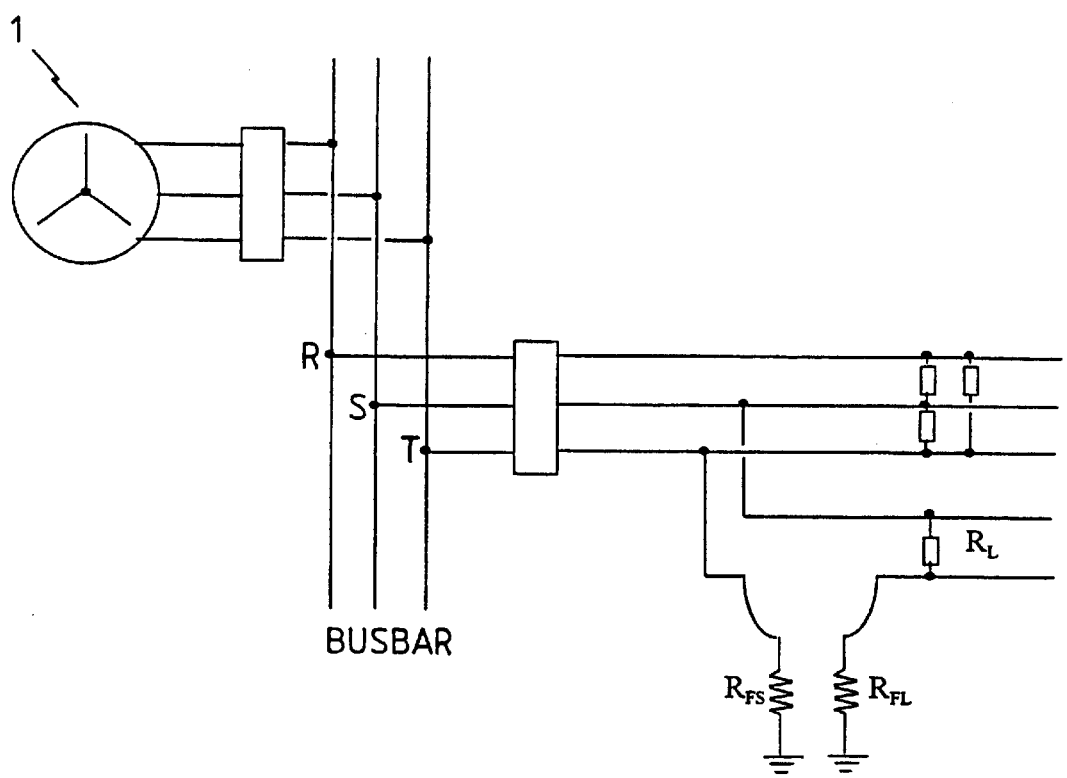
FIGS. 5a and 5b are schematic arrangements of a network showing a single phase conductor break and a three phase conductor break, respectively.
Figure 5B:
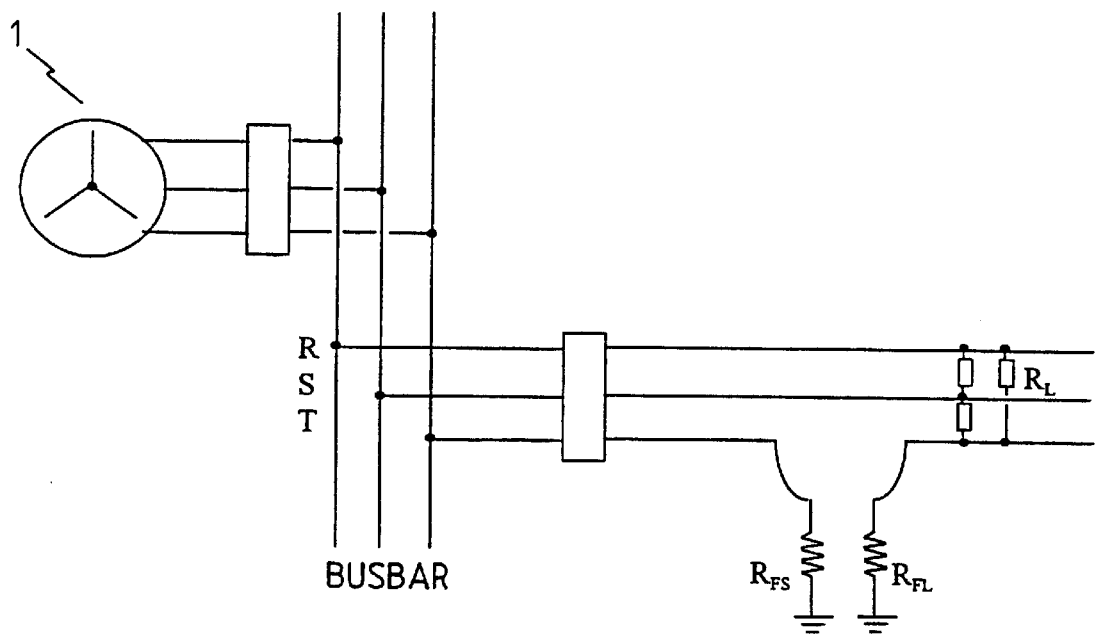

Conductor breaks on three phase sections of network are more complex, as illustrated in FIG. 5b. If the conductor is on the ground on the source side of the break, the situation is straightforward and can be detected as a simple earth fault on the affected phase. However, where the conductor connects to ground on the load side of the break, two phases back-feed into the fault through the downstream load $R_L$. The effect is similar to having a voltage, half the phase voltage in magnitude but in phase opposition to the affected phase, applied across $R_L/2$ and the ground resistance of the fallen conductor $R_{FL}$. The change in residual current for the affected feeder will likewise be in phase opposition to one of the phase voltages to earth. This is opposite to the situation for a simple earth fault as discussed above.

Figure 6A:
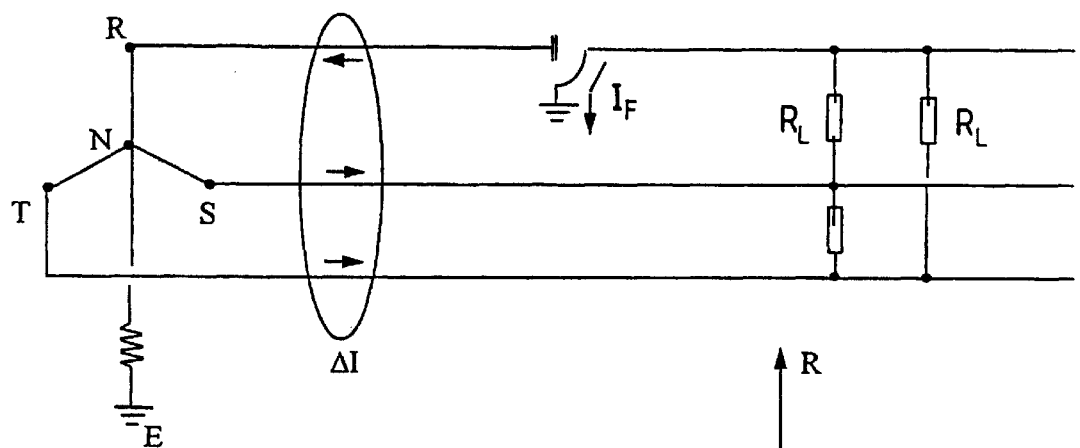
FIGS. 6a and 6b are a schematic diagram of a network showing a roadside break on a three phase line and a phasor diagram illustrating the resultant residual currents, respectively.
Figure 6B:
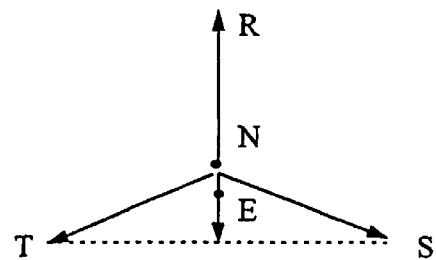

As illustrated in FIGS. 6a and 6b, with a loadside break on a three phase line there is a reduction in load current for the faulted phase. The fault is back-fed through the load $R_L$ from the other two phases. The fault current $I_F$ is limited by the load impedances $R_L$ and the fault resistance $R_F$. This fault current $I_F$ will flow back into the neutral through the system earthing impedance $R_N$. This will give a residual current $I_O$ for the affected feeder F in phase opposition with the faulted phase R. There will also be a reduction in load current for the load downstream of the fault on the other two phases. This type of fault is firstly characterised by a residual current on the affected feeder in phase opposition with one of the phase to earth voltages. Similar indications can also arise when paralleling networks as detailed hereinafter. Analysis of the incremental phase currents can discriminate between these situations. For a three phase load-side conductor break there will be a reduction in current on the affected phase with lesser reductions on the other two phases. These incremental changes will be balanced by the residual current. The pattern of current changes is specific to this type of fault and can therefore be used to identify it.

When this type of fault is identified the affected feeder is normally switched out. It is not possible to apply faulted phase earthing (FPE) techniques since two phases are back-feeding the fault. Conductor breaks are more common on single phase networks and a three phase load-side break is a rare occurrence.

Single pole switching or fuse blowing switches a section of conductor in or out together with the section's associated capacitance to earth. There is a change in load current but this does not affect the residual current for that feeder. It is the change in capacitive current to earth which gives rise to a change in residual current. For a simple switching in or out event, the change in residual current will be in quadrature with the affected phase. This effect can be used to discriminate such normal operational events from true earth faults.

Single pole switching is complicated by the fact that when a section of conductor is "switched out" it is back-connected to the other phase(s) through the downstream load. The inherent conductor capacitance is effectively transferred from one phase to the other phase(s). In the case of single pole switching on single phase network, the overall effect is that the residual current arising from such an event is either directly in phase with or in opposition to the phase to earth voltage for the unaffected phase, as indicated in FIG. 3. This behaviour is known to mimic an earth fault and cannot be discriminated using wattmetric relays, etc. The event can be discriminated again by analysing the incremental phase currents associated with switching. The residual current is in phase with or in opposition to one of the phase to earth voltages, where the phase in question is the unaffected phase. There is no change in current on that phase and there are incremental changes in current on the other two phases, which are equal in magnitude and which add to the residual current. This pattern uniquely identifies the event.

Single pole switching in three phase sections of network does not introduce any additional complexity. Opening a first switch or closing the last switch causes a residual current significantly out of phase with one of the phase to earth voltages. Operating the second of three switches creates an effect similar to that described above for a single phase network. Opening the last switch or closing the first switch is similar to switching in a simple capacitance and is easily identified in the residual current alone. The frequency of single phase switching or fuse blowing on rural MV networks requires that sensitive earth fault protection must be able to discriminate such events and ignore them as part of normal operations.

Figure 7:
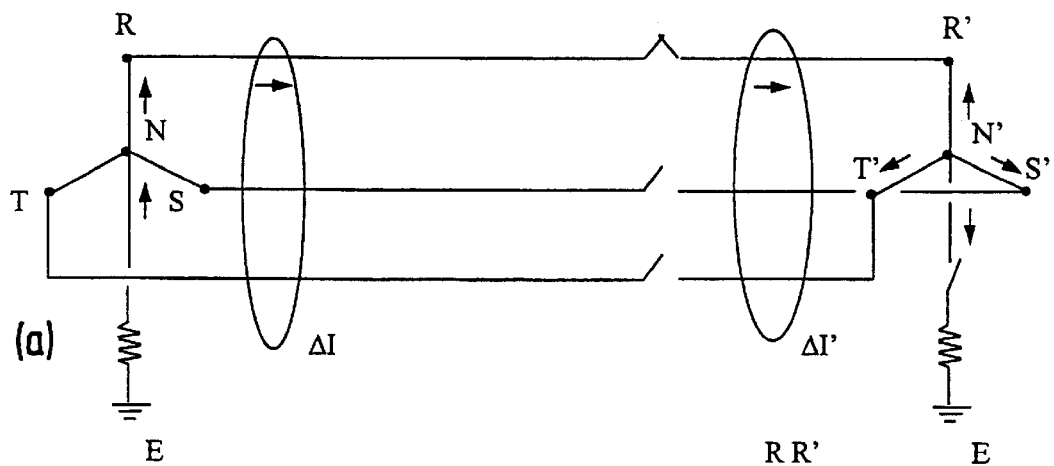
FIGS. 7a and 7b are schematic arrangements of a paralleled network showing current flows when a first phase and a second phase is closed using single pole switching, respectively.
FIGS. 7c and 7d are phasor diagrams illustrating the resultant residual currents, respectively.
Figure 7:
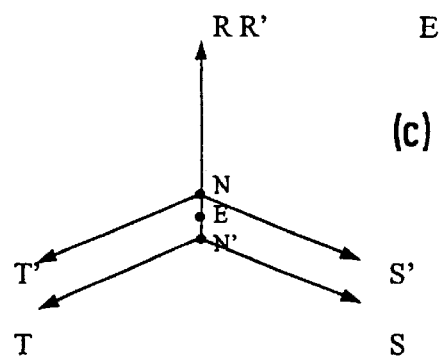
Figure 7:
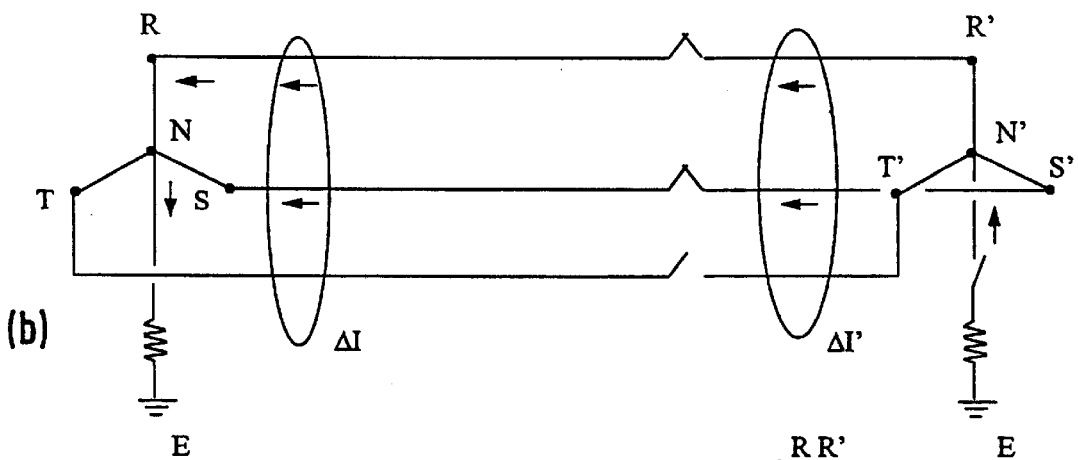
Figure 7:
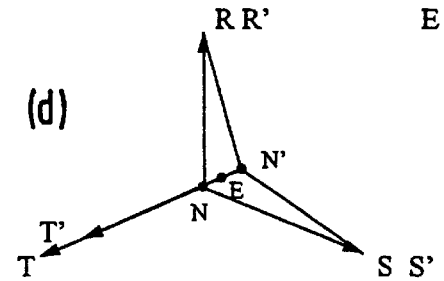

Referring now to FIGS. 7a and 7b, the use of single pole switching to parallel between networks is known to cause network disturbances. "Switching in" a first phase can cause a neutral shift on the networks at both sides of the switch SW. Any difference in voltage drop between the networks, that is appearing across the open switch SW, is impressed between the neutrals N,N' when the switch SW is closed. This can cause circulating currents through the neutral earthing impedances between the two networks. This circulating current will be directly in phase with the phase to neutral voltage $V_{PN}$ for the phase switched on one side and in phase opposition on the other side. Where the circulating current is in phase with the voltage, the event is indistinguishable from an earth fault. This circulating current can operate the earth fault protection.

The most effective way to overcome this problem for networks with earthed neutrals is by banning single pole switching for paralleling duty. Triple pole switches are installed instead. An alternative approach is to detect the conditions at the remote end of the network. Here the circulating current will be flowing in opposition to one of the phases. Furthermore, there will only be an incremental current in the phase affected. The condition can therefore be detected by this unique pattern of currents. The neutral earthing switch on this side can then be opened temporarily to break the loop. This prevents the earth fault protection at the source station end from operating. The earthing switch can be closed when the paralleling operation is complete. This will be indicated by the voltage displacement on the neutral returning to normal.

As illustrated in FIGS. 7c and 7d on closing the second switch for single pole paralleling, any neutral displacement is effectively halved. A smaller circulating current will tend to flow through the neutrals N,N' between the two networks. If one of the earthing switches is open as described above there is no circulating current. If both neutrals are fully earthed then the circulating current will flow in line with one of the phases on one side and in opposition on the other side. The condition is detected on the side where the circulating current flow in phase opposition as before, however, the pattern of incremental phase currents is different. There are small incremental currents in phase with the voltage on the two phases affected and the pattern characterises this event. The earth switch can again be temporarily opened on this side as above to prevent the earth fault protection at the other end from operating.

Figure 8A:
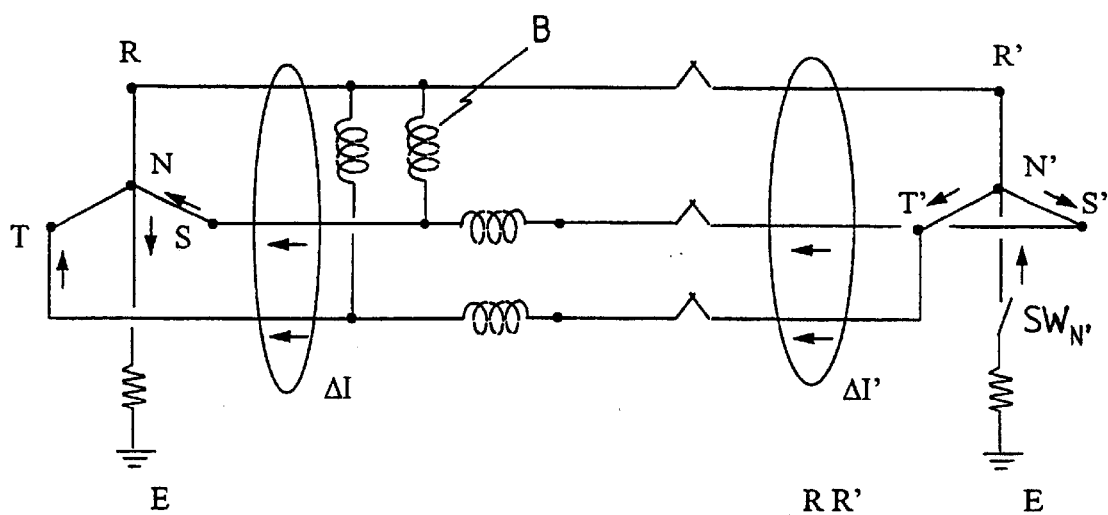
FIGS. 8a and 8b are a schematic diagram of a paralleled network having a booster and a phasor diagram illustrating the resultant currents.
Figure 8B:
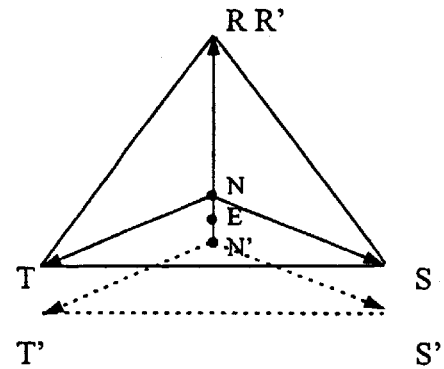

Paralleling between networks with a booster in circuit, as illustrated in FIG. 8a and with reference to FIG. 8b, also creates problems. An open delta booster arrangement B causes a shift in the neutral voltage $V_{NE}$ downstream of the booster. For example, a set of boosters on 5% boost will shift the downstream neutral N' by 5%. When two networks are paralleled with a booster B in circuit, this neutral displacement is impressed across the neutrals N,N' of the two networks and causes circulating currents between the two networks, especially where the neutrals are earthed. This particular problem which arises also in paralleling is not alleviated by the provision of triple pole switches. This problem is akin to that described above for paralleling through single pole switches, having two poles of a paralleling switch closed, except that the neutral displacement is more pronounced. There is an in-phase circulating current on the two phases being boosted, and the residual current from these return in the neutral to earth connections of both networks. The residual current is directly in phase with the non-boosted phase voltage on one side and in phase opposition on the other side. The residual current in phase opposition is detectable and analysis of the incremental phase currents identifies the pattern of circulating currents in two of the phases with no current change in the third phase. The downstream or remote end neutral switch $SW_{N'}$ is then temporarily opened to break the loop. This action prevents the earth fault protection at the remote end from opening. The switch is closed when the neutral displacement returns to normal.

The pattern of current changes associated with this event is the same as that for paralleling between networks with two single pole switches closed and the required response is the same, that is to break the loop. There is no need to further discriminate between the above two events.

While the problems arising from paralleling with single pole switches is avoided using triple pole switches, this solution has no impact on the problem of paralleling through open delta boosters. One solution is to use three boosters in a closed delta formation, however, this arrangement has inherent disadvantages as independent operation of the boosters can cause some neutral shift which may activate sensitive earth fault protection. De-tuning the protection to such circulating currents for booster operation also de-tunes the protection from the effects arising in single pole switching in paralleling operations.

As outlined above, the requirements for good performance earth fault protection on overhead MV networks are extremely demanding. Assessing faults using residual quantities as performed with traditional earth fault protection methods is insufficient necessitating the use of incremental currents arising in phases. This requires sophisticated processing of the information from the networks which is realised by a dedicated controller.

The residual quantities are readily accessible and can be obtained from current transformer readings for each feeder and for any neutral earthing resistor or impedance. The residual voltage or neutral displacement can be obtained similarly from voltage transformer readings. Accessing the incremental currents arising in the phases from a network disturbance is accomplished by subtracting the phase currents immediately before an event from those immediately after it. This differencing technique when applied over a very short period effectively cancels out the load currents flowing in the phases and shows up the incremental currents arising from a network disturbance.

To monitor for a network disturbance, both the neutral voltage displacement and any neutral current flowing in the neutral earthing resistor is assessed. The neutral voltage displacement can be derived by adding the three phase voltages to earth from the voltage transformer readings. By monitoring this quantity, the use of isolated neutral networks or networks in which a neutral earthing resistor may be switched out is facilitated.

If a change occurs in either of these quantities above defined thresholds, the residual currents from each feeder are analysed. The incremental residual currents associated with the event are derived and values for the past few cycles are continuously stored in controller memory for access when a disturbance occurs. The values before the event are then subtracted from those immediately after it. This subtraction cancels the effect of any imbalance in the networks, current transformer reading errors, etc.

The residual currents are checked against the phase to earth voltages and in the event of an earth fault, there is close alignment with one of the phase to earth voltages on the faulted feeder. This alignment identifies both the faulted feeder and the faulted phase. It is necessary to eliminate a single phase switching event as the cause of the alignment.

The incremental phase currents on the faulted feeder are analysed. As before, values over the preceding cycles are continuously stored for all feeders. In the event of a disturbance these values are frozen in memory and are subtracted from the values immediately following the event. When a fault occurs there is an incremental current comparable to the residual current in the faulted phase. If the event is a single phase switching event there are incremental currents in the other two phases only. On detecting an earth fault, the faulted phase earthing (FPE) switches are operated. For a switching event the controller is simply reset.

The residual currents are also checked for phase opposition with one of the phase to earth voltages. On detecting phase opposition for a feeder, the incremental phase currents for that feeder are further analysed to discriminate the nature of the event. If there are incremental currents on the faulted phase only or on the other two phases only with close alignment to the phase voltages, a paralleling event either through boosters or single pole switching is indicated. The neutral earthing switch is then opened to break the neutral loop and to prevent protection operation at the other end of the network. The neutral displacement is monitored to detect restoration of normal conditions and subsequently to reclose the neutral earth switch.

If there are incremental phase currents in all phases, with the current in the faulted phase flowing in the opposite direction to the residual current, than a loadside conductor break in three phase network is indicated. The faulted feeder is "switched out". Otherwise, a single phase switching event is indicated. The event is ignored and the controller reset.

It will be seen that since incremental quantities are used, network imbalance does not affect the sensitivity of earth fault detection. Sensitivity is maintained even with very abnormal network conditions.

It is necessary to check whether the earth fault is still on the system when the FPE switch is opened. This is done by checking the residual current on the faulted feeder before and after the switch is opened. On opening the switch, the full phase to neutral voltage is established across the fault and there will be a resulting step change in current into the fault. This incremental current is directly in phase with the phase to earth voltage, providing a clear indication that the fault is still present.

The purpose of the neutral resistor is to stabilise the network and absorb the voltage transients particularly when "switching on" the FPE switches. Such voltage transients can cause damage to the healthy phases and precipitate cross-country faults. As these faults are damaging, it is necessary to seek to minimise their occurrence. The neutral resistor reduces the incidence of cross-country faults.

The controller identifies the nature of the fault or disturbance and indicates this information to the operator. The faulted feeder and phase and the magnitude of fault currents are also indicated. Furthermore, the fault data is readily analysable to indicate the fault resistance.

Cross-country fault protection may be provided by a feeder circuit breaker or recloser. For 20 kV networks this switchgear is equipped with a current transformer on each phase for full phase coverage. An instantaneous trip (I>>) is set for residual currents exceeding 400 A. Backup protection, if necessary, is provided by detecting through the controller excessive currents in the FPE switch earth lead and consequently, tripping transformer circuit breaker(s).

Figure 9:
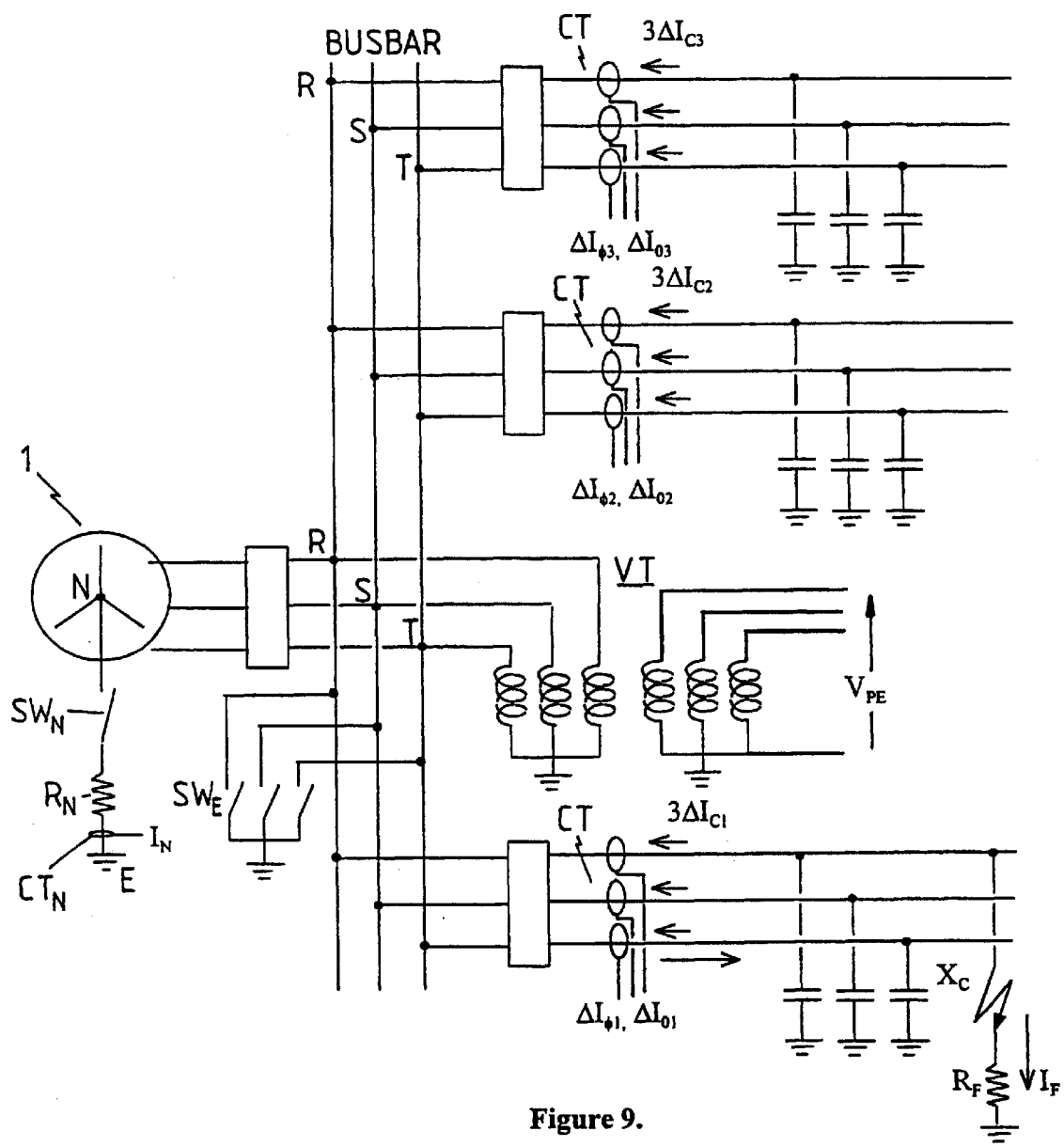
FIG. 9 is a schematic diagram of a network incorporating high impedance resistance earthing and faulted phase earthing (FPE) protection.

A distribution network having a high impedance neutral earthing system is shown in FIG. 9. The network layout is identical to the general arrangement shown in FIG. 2 with certain modifications. Firstly, for high impedance 20 kV networks, the changes include the replacement of the existing neutral earthing resistor $R_N$ with a higher impedance 300 ohm unit. This unit has a correspondingly lower power rating. FPE protection is provided using three single phase earthing switches $SW_E$. A single phase switch $SW_N$ in the neutral earthing resistor link is also provided.

Voltage signals are taken from three phase to earth voltage transformers VT on the busbar. The neutral voltage displacement can be derived internally in the controller by adding the phase to earth voltages. A common set of three voltage transformers can serve all voltage measurement needs, that is, for voltage regulation, energy meters, etc.

The phase currents for each feeder are taken back to the controller from current transformers CT. For outlets equipped with circuit breakers the current transformers CT are tapped. In the case of outlets with reclosers equipped the current transformers CT are internally disposed in the reclosers. If the current transformer secondary windings are accessible then the relevant signals can be taken from these. Small secondary instrument class current transformers may be used to transform the current transformers secondary currents to still lower levels for input to an electronic interfacing card. If the recloser current transformers cannot be accessed then a set of turret current transformers are installed on the recloser bushings. Again, the residual currents are derived internally in the controller by adding the phase currents. There is a current transformer $CT_N$ on the neutral resistor to monitor resistor currents $I_N$.

Figure 10:
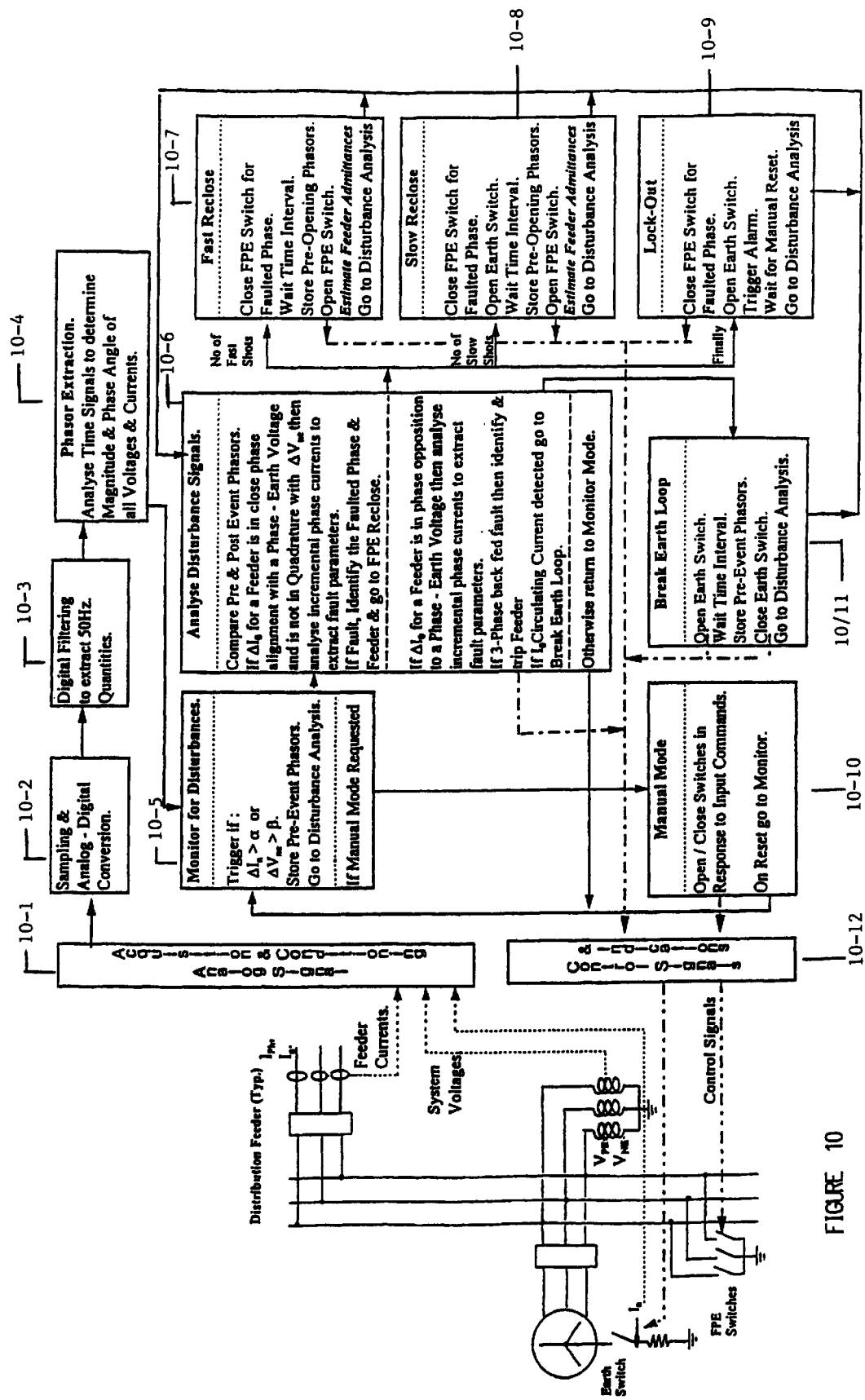
FIG. 10 is a schematic block diagram of a controller for operating the fault detection apparatus of the invention.

A dedicated controller, whose operation is shown schematically in FIG. 10, is provided with signal acquisition interface cards 10-1 for accepting measurement data from the current transformers CT on each phase, the earth linkage current transformer $CT_N$ and the voltage transformers VT connected across the busbar. The data signals are conditioned, sampled and converted to digital data signals through analog to digital converters (ADCs) 10-2. The signals are then digitally filtered in Digital Filtering 10-3 to extract 50 Hz quantities. Utilising phasor extraction techniques in Phasor Extraction 10-4, the signals are analysed to determine the magnitude and phase of the measured quantities. The analysed data is stored in controller memory or in a shift register. New data is monitored in Monitor for Disturbances 10-5 for disturbances which indicate a fault, for example, the earth linkage current $I_N$ or a neutral voltage shift $\Delta V_{NE}$ exceeds a predetermined threshold level ($\Delta I_N > \alpha$ or $\Delta V_{NE} > \beta$), and if such a indication is present, the data in memory is compared to the new data using a comparator in Analyse Disturbance Signals 10-6 of the apparatus. The new data set or post-event pattern and existing data sets or pre-event signal patterns are comparatively analysed to determine the cause of the disturbance. This determination is performed using an event characteristic generated from the comparative analysis. This event characteristic may for example take the form of a phasor diagram. The characteristic can include a variety of discriminators to isolate network operations from fault conditions. The discriminators may for example indicate a faulted feeder or faulted phase. Similarly the characteristic may include registers or flags to differentiate between different types of fault conditions and indeed between different permissible network operational events.

Where the fault persists or recurs, "lock-out" 10-9 can be initiated where the FPE switch on the faulted phase is closed, the neutral-earth linkage switch is opened and an alarm is triggered. In this case, manual intervention can be needed before the FPE switch and linkage switch are returned to their normal operating positions.

In the event of a disturbance condition, where circulating currents are detected, the normally closed neutral-earth linkage switch is opened to break the zero sequence current loop 10-11 and prevent other production from operating. Following a predetermined clearing period, all magnitude and phase information is stored before reclosing the linkage switch. The comparator means then compares the stored information with information acquired after the neutral-earth linkage switch is closed. If the disturbance is still present, the linkage switch is opened again. If no disturbance is present the monitoring means resets and continues to analyse the time based signal until a disturbance condition is recognized and the trigger is activated.

An manual mode 10-10 is provided to facilitate the manual activation of FPE switches and the neutral-early linkage switch. A reset mode is also provided for resetting the fault detecting apparatus after "lock-out".

On detecting an earth fault, the earth switch for the faulted phase is closed and is re-opened after a short period, such as one second, to check whether the fault has cleared as a transient fault. If the fault persists, the earth switch is closed again and left closed in Lock-Out 10-9 as a permanent fault which calls for manual intervention.

Figure 10A:
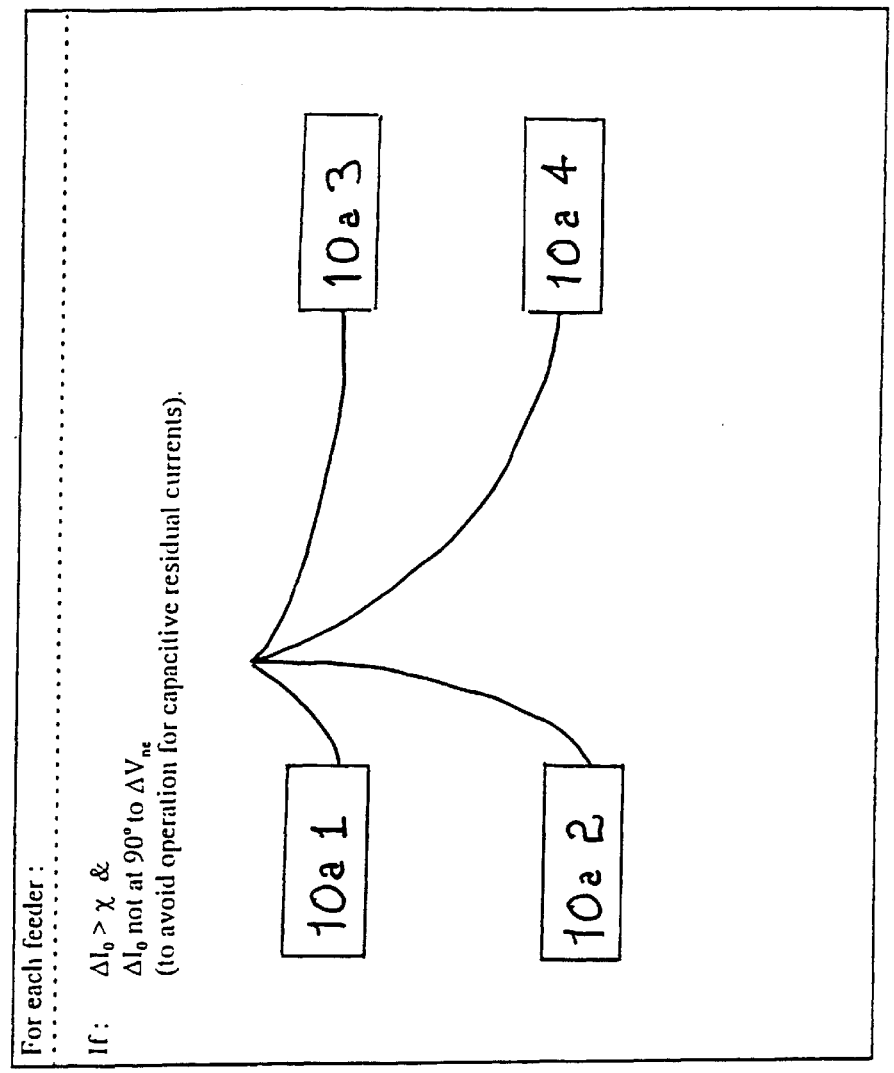
FIG. 10a is a detailed schematic block diagram of the signal analysis block of the controller of FIG. 10.

As detailed in FIG. 10a, when a disturbance has been detected, a further level of analysis is carried out to determine on which feeder and phase the disturbance has occurred. The incremental zero sequence currents $\Delta I_O$ on each feeder in turn are analysed to determine whether they exceed a predetermined threshold ($\Delta I_O > \chi$) and that they are not in quadrature with the change in the neutral to earth voltage ($\Delta I_O \neq 90°$ w.r.t. $\Delta V_{NE}$). Then if for any phase Angle between $\Delta I_O$ and $V_{PE} < \delta$: Implement mathematical technique to analyse incremental phase currents and segregate the effects of a fault from those associated with a load change or dropping of a conductor indicated at 10a.1.

If the identified fault resistance $R_f$ is sufficiently low then signal a fault and initiate the reclosure cycles Faulted Phase Earthing switches indicated at 10a.2.

Alternatively, if for any phase Angle between $\Delta I_O$ and $-V_{PE} < \delta$ (i.e. is in phase oppostion): Implement mathematical technique to analyse incremental phase currents and segregate the effects of a fault from those associated with a load change or dropping of conductor indicated at 10a.3.

If the identified fault resistance $R_f$ is sufficiently low then further analyse to segregate a back fed 3 phase fault from parallel operation through a booster. If a fault is identified open the Circuit Breaker for the feeder indicated at 10a.4.

From the above, if a fault is indicated on a feeder, the phase angle of the change in zero sequence current is examined to determine whether it is within a predetermined angle of one of the phase to earth voltages ($\Delta I_O = V_{PE} \pm \delta^O$). If so, a single phase to earth fault is indicated, with or without a broken conductor, and a mathematical algorithm is activated to analyse the incremental changes in phase currents ($\Delta I_R$, $\Delta I_S$, $\Delta I_T$) and phase to earth voltages ($V_{RE}$, $V_{SE}$, $V_{TE}$) to estimate the values for the earth fault resistance, change in connected load and change in length of connected conductor on each of the three phases.

As shown in FIG. 10b, a fault resistance $R_F$ is most easily analysed as an admittance $Y_{RF}$. With the establishment of the fault and its corresponding admittance $Y_{RF}$ there will be an associated loss of load ($\Delta L_{RS}$, $\Delta L_{ST}$, $\Delta L_{TR}$) and a loss of a length of network connected to each phase characterised by the line capacitances for those lengths $\Delta C_R$, $\Delta C_S$, $\Delta C_T$. The changes in current (for a fault on R phase) will be given by the matrix equation represented as FIG. 10c. The sub-subscripts (x and y) indicate the real and imaginary components of the measured quantities. The solution of this matrix equation yields estimates for the fault resistance, the lengths of conductor dropped on each phase and the amount of load dropped from each phase pairing. The equations for earth faults on the S and T phases are similar to that shown in FIG. 10c.

Before solving the matrix equation, the measured currents ($\Delta I_R$, $\Delta I_S$, $\Delta I_T$) are corrected to take account of the currents generated by the neutral voltage displacement and the natural phase to earth admittances for each feeder. The admittances for each feeder are automatically recalculated each time there is an operation of any of the faulted phase earthing switches.

If the calculated fault resistance $R_F$ is sufficiently low, than a faulted phase earthing is initiated.

Alternatively, if the change in zero sequence current for the suspect feeder is within a predetermined angle of being in phase opposition to one of the phase to earth voltages ($\Delta I_O = V_{PE} - 180° \pm \delta^O$), either a back-fed three phase fault or network paralleling operation through boosters is indicated. In this case, a mathematical algorithm, similar to that described above but with the phase voltages reversed ($V_{PE} \rightarrow -V_{PE}$), is activated. If the calculated fault resistance $R_F$ is sufficiently low, further analysis is used to segregate a back-fed three phase fault from a parallel operation through a booster B. If a back-fed fault is identified then the relevant feeder is tripped. If a paralleling operation is indicated, the neutral earth linkage switch $SW_N$ is opened to break any circulating currents which may be flowing between the neutrals of the source and remote substations (see FIG. 8b).

Otherwise, if no feeder satisfies the above fault detection criteria, the disturbance is likely to be caused by a normal operational event and the controller returns to monitoring for disturbances as before.

The values $\alpha$, $\beta$, $\chi$ and $\delta$ referred to above are operation parameters which can be changed to fine tune the sensitivity and discrimination of the controller.

Figure 10D:
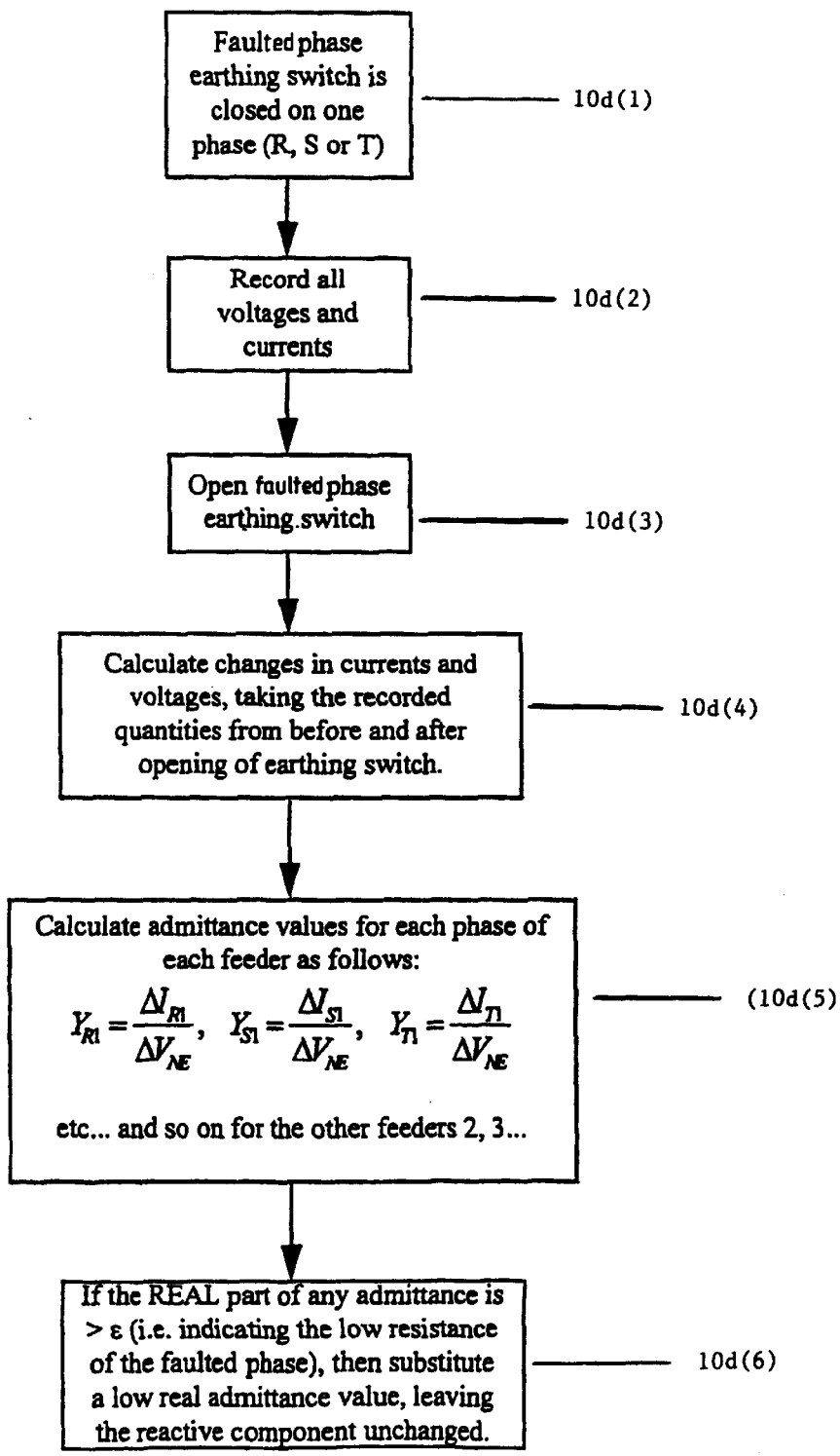
FIG. 10d is a flow chart detailing the calculation of feeder admittance values.

In the FPE reclose operation, two options are provided namely, fast reclose 10-7 and slow reclose 10-8. In fast reclose 10-7, the FPE switch is closed for the faulted phase and after a predetermined time interval, the phase and magnitude are extracted from acquired data signals and stored before the FPE switch is opened again. After the FPE switch is opened again, feeder admittances $Y_R$ are estimated 10d(1)–(6) in FIG. 10d. Subsequent data is analyzed for the same disturbance and if it persists, the FPE switch is closed again. In slow reclose 10-8, after the FPE switch is closed, the earth linkage switch $SW_N$ is opened, otherwise fast and slow reclose are identical. If the fault persists, "lock out" is initiated. During lock out, the FPE switch for the faulted phase is closed, the earth linkage switch is opened and an alarm is triggered to attract manual intervention.

The controller 10-12 has outputs to operate FPE switches, the neutral resistor switch and to trip the feeder circuit breakers. Status output to a distribution station alarm panel and to a Supervising Control and Data Acquisition (SCADA) Remote Terminal Unit (RTU) is provided.

A LABVIEW system (National Instruments, Austin, Tex., United States of America) was used to develop the prototype. This system is based around a PC and provides the data acquisition and interfacing hardware to acquire the necessary signals. It also provides the basic building blocks for processing the data and assembling the logic of a system in software. This provides a flexible environment for developing a prototype controller and for adapting it based on field experience.

However, this arrangement is not satisfactory for a final controller suitable for deployment across a wide range of locations. Firstly, it is too expensive and PCs are not considered sufficiently robust or reliable over the long term. A dedicated controller assembled from existing hardware is built from the software design. This still uses digital technology but implements the desired functions in a compact box similar to a modern digital relay. Even with the FPE system, the feeder circuit breakers/reclosers are still equipped with conventional earth fault protection. This is set to serve as a backup for failure of the FPE system. The sensitive earth fault (SEF) protection on the feeders is set high to avoid spurious operation and only operates for failure of the FPE system. The earth fault protection on the feeders additionally provides cross-county fault protection.

The controller is sufficiently versatile to serve a wide range of duties. The immediate application is for high impedance earthed 20 kV networks.

Finally, with reference to FIG. 11, the disturbance event patterns referred to above are tabulated to form a summary of faults anticipated on an electrical distribution network. In the nomenclature of the summary FP refers to a faulted phase and HP refers to a healthy phase.

It will of course be understood that the invention is not limited to the specific details described herein, which are given by way of example only, and that various modifications and alterations are possible within the scope of the invention.

What is claimed is:

1. A fault detection apparatus for use in an electrical distribution network comprising:

one or more feeders, each feeder having a plurality of phases for delivering power to a load connection of the network;

a power source, producing electrical power for each feeder; and a signal acquisition means for communicating within the network and measuring network signals;

wherein the signal acquisition means is connected to a comparator and incorporates:

means for identifying and storing a pre-event signal pattern from the electrical distribution network;

monitoring means for detecting an event in the electrical distribution network and activating the signal acquisition means to identify a post-event signal pattern; and means for delivering the pre-event signal pattern and the post-event signal pattern to the comparator;

the comparator including means for comparatively analyzing the pre-event signal pattern and the post-event signal pattern and identifying a phase from the plurality of phases where a fault condition is detected based on the analyzing.

2. The fault detection apparatus as claimed in claim 1 wherein the comparator incorporates means for generating an event characteristic from the pre-event signal pattern and the post-event signal pattern to identify an event type associated with a fault and another event type associated with a switching event.

3. The fault detection apparatus as claimed in claim 2 wherein the event characteristic includes a faulted feeder discriminator.

4. The fault detection apparatus as claim in claim 2 wherein the event characteristic includes a faulted phase discriminator derived from examined phasor values.

5. The fault detection apparatus as claimed in claim 2 wherein the event characteristic is parsable to identify a fault condition on the electrical distribution network, the event characteristic being parsable to differentiate between an earth fault and a backfed fault and to identify a conductor break.

6. The fault detection apparatus as claimed in claim 5 wherein the fault condition identified is a source side fault.

7. The fault detection apparatus as claimed in claim 5 wherein the fault condition identified is a load side fault.

8. The fault detection apparatus as claimed in claim 5 wherein the event characteristic incorporates an operations event register for distinguishing network operations from network faults.

9. The fault detection apparatus as claimed in claim 8 wherein the operational event register incorporates means for indicating a switching event.

10. The fault detection apparatus as claimed in claim 8 wherein the operational event register incorporates means for indicating a paralleling event in the electrical distribution network.

11. The fault detection apparatus as claimed in claim 1 wherein the signal acquisition means comprises:

a current transformer for reading a phase current from a phase of a feeder;

a current transformer for reading an earth linkage current; and a voltage transformer for reading phase voltages.

12. The fault detection apparatus as claimed in claim 11 wherein the signal acquisitions means incorporates signal conditioners.

13. The fault detection apparatus as claimed in claim 1 wherein the monitoring means incorporates means for assessing instantaneous phase currents and voltages.

14. The fault detection apparatus as claimed in claim 13 wherein the monitoring means comprises means for analyzing time based signals to determine the magnitude and phase of all current and voltages.

15. The fault detection apparatus as claimed in claim 1 wherein the comparator incorporates means for comparing instantaneous phase currents and voltages from preceding phase currents and voltages to produce incremental values.

16. The fault detection apparatus as claimed in claim 1 where the apparatus further incorporates switching means to prevent damage to the network when a fault condition is detected.

17. The fault detection apparatus as claimed in claim 1 where the apparatus further incorporates switching means to prevent injury to personnel when a fault condition is detected.

18. The electrical distribution network for discriminating between network operational events and fault conditions using a fault detection apparatus as claimed in claim 1.

19. A method for fault detection in an electrical distribution network comprising the steps of:

identifying and storing a pre-event signal pattern from the network;

monitoring a plurality of phases in the electrical distribution network to detect an event in the network;

identifying and storing a post-event signal pattern in response to the monitored event;

comparatively analysing the pre-event signal pattern and the post-event signal pattern; and identifying a phase from the plurality of phases where a fault condition is detected based on the analysing.

20. The method as claimed in claim 19 wherein the step of comparatively analysing the pre-event signal pattern and the post-event signal pattern comprises the steps of:

monitoring instantaneous phase current and voltages;

comparing instantaneous phase currents and voltages with preceding phase currents and voltages to produce incremental values;

determining whether the incremental values exceed predetermined threshold values or phase angles approach predetermined quantities; and discriminating currents and voltages generated from values generated during fault switching and normal operating generating an event characteristic from the pre-event signal pattern and the post-event signal pattern to identify an event type associated with a fault and another type associated with a switching event.

21. An electrical distribution network for discriminating between network operational events and fault conditions using a fault detection apparatus implementing a method as claimed in claim 19.

22. A fault detection apparatus for use in an electrical distribution network comprising:

one or more feeders, each feeder having a plurality of phases for delivering power to a load connection of the network;

a power source, producing electrical power for each feeder; and a signal acquisition means for communicating within the network and measuring network signals;

wherein the signal acquisition means is connected to a comparator and incorporates:
a current transformer for reading a phase current from a phase of a feeder;
a current transformer for reading an earth linkage phase; a voltage transformer for reading phase voltages;
means for identifying and storing a pre-event signal pattern from the electrical distribution network;
monitoring means for detecting an event in the electrical distribution network and activating the signal acquisition means to identify a post-event signal pattern; and
means for delivering the pre-event signal pattern and the post-event signal pattern to the comparator;

wherein the comparator comprises:
means for comparatively analyzing the pre-event signal pattern and the post-event signal pattern and identifying a phase from the plurality of phases where a fault condition is detected based on the analyzing; and
means for comparing instantaneous phase currents and voltages from preceding phase currents and voltages to produce incremental values.

23. The fault detection apparatus as claimed in claim 22 where the apparatus further incorporates switching means to prevent injury to personnel when a fault condition is detected.

* * * * *